United States Patent
Liu et al.

(10) Patent No.: US 11,145,989 B2
(45) Date of Patent: Oct. 12, 2021

(54) CONTROLLABLE WAVE-ABSORBING METAMATERIAL

(71) Applicant: KUANG-CHI CUTTING EDGE TECHNOLOGY LTD., Shenzhen (CN)

(72) Inventors: Ruopeng Liu, Shenzhen (CN); Zhiya Zhao, Shenzhen (CN); Jinguo Huang, Shenzhen (CN); Mingjun Xing, Shenzhen (CN); Tian Zhou, Shenzhen (CN); Xingxing Huang, Shenzhen (CN)

(73) Assignee: KUANG-CHI CUTTING EDGE TECHNOLOGY LTD., Shenzhen (CN)

( * ) Notice: Subject to any disclaimer, the term of this patent is extended or adjusted under 35 U.S.C. 154(b) by 0 days.

(21) Appl. No.: 16/910,894

(22) Filed: Jun. 24, 2020

(65) Prior Publication Data

US 2020/0321705 A1 Oct. 8, 2020

Related U.S. Application Data

(63) Continuation of application No. PCT/CN2018/079864, filed on Mar. 21, 2018.

(51) Int. Cl.
*H01Q 17/00* (2006.01)
*H05K 9/00* (2006.01)

(52) U.S. Cl.
CPC .......... *H01Q 17/007* (2013.01); *H01Q 17/008* (2013.01); *H05K 9/0081* (2013.01)

(58) Field of Classification Search
None
See application file for complete search history.

(56) References Cited

U.S. PATENT DOCUMENTS

2019/0339418 A1* 11/2019 Sirbuly ................. G03F 7/0015

FOREIGN PATENT DOCUMENTS

| CN | 203760676 U | 8/2014 |
| CN | 205303688 U | 6/2016 |

(Continued)

OTHER PUBLICATIONS

International Search Report for corresponding International Application No. PCT/CN2018/079864, dated Sep. 22, 2018, 3 pages.

*Primary Examiner* — Whitney Moore
(74) *Attorney, Agent, or Firm* — Armstrong Teasdale, LLP (57) ABSTRACT

The disclosure discloses a controllable wave-absorbing metamaterial including a substrate and a metamaterial unit array layer. Each conductive geometric unit includes a first hollow structure, second hollow structures, and conductive geometric structures. The second hollow structures are respectively extended from four vertices of the first hollow structure, and the conductive geometric structure is disposed between each two adjacent second hollow structures. The first end of the second hollow structure is provided with a varactor diode connected to the conductive geometric structures at both sides, the second end of the second hollow structure is provided with a fixed capacitor and a fixed resistor; the fixed capacitor is connected to the conductive geometric structure at one side, and the fixed resistor is connected to the conductive geometric structure at the other side. Therefore, active adjustment on a wave-absorption frequency band can be implemented, and power consumption is very low.

19 Claims, 4 Drawing Sheets

(56) References Cited

FOREIGN PATENT DOCUMENTS

| | | | |
|---|---|---|---|
| CN | 106058478 | A | 10/2016 |
| CN | 107069234 | A | 8/2017 |
| JP | 2001339191 | A | 12/2001 |

* cited by examiner

CONTROLLABLE WAVE-ABSORBING METAMATERIAL

CROSS-REFERENCE TO RELATED APPLICATIONS

The present application is a continuation of International Patent Application No. PCT/CN2018/079864, filed on Mar. 21, 2018, and claims priority to Chinese patent Application No. 201711472931.1, filed on Dec. 29, 2017, the contents of which are hereby incorporated by reference in their entirety.

TECHNICAL FIELD

The disclosure relates to the field of materials, and particularly, to a controllable wave-absorbing metamaterial.

BACKGROUND

A metamaterial is a special composite material or structure, by orderly designing the key physical dimensions of the material, it can obtain the extraordinary physical properties that conventional materials do not have.

By designing the basic material composition, the periodic unit shape and the arrangement of the metamaterial, the corresponding resonance characteristics can be obtained as required. In addition, the metamaterial also absorbs radar waves based on impedance matching and attenuation characteristics.

Impedance matching between the metamaterial and the external environment can minimize reflection of incident electromagnetic waves on the surface of the metamaterial, and ensure that the incident electromagnetic waves enter the interior of the metamaterial as much as possible. Moreover, the electromagnetic wave that enters the metamaterial is rapidly attenuated based on efficient attenuation characteristics.

In addition, the use of wave-absorbing metamaterials can effectively eliminate the radar cross section (RCS) of the target. Currently, the applied wave-absorbing materials are passive. Some academics have already conducted research on active controllable wave-absorbing materials.

For example, the solution disclosed in the prior art is to generate an absorption peak in the microwave band by using a combination of semicircular and triangular microstructures, and to achieve electrical adjustment of the absorption peak position by embedding a variable capacitor between the semicircular and triangular microstructures. However, the microwave absorption characteristic of the existing solution is only effective for one polarization, and has no adjustable wave absorption effect for the other polarization.

For the problems in the related art, no effective solutions have been proposed yet.

SUMMARY

For the problems in the related art, the disclosure proposes a controllable wave-absorbing metamaterial. A resistor and a varactor diode are introduced into the metamaterial structure, and the connection manner of the conductive geometric unit and the conductive geometric structure in the conductive geometric unit is reasonably designed, such that the absorption frequency band of the metamaterial can be changed by changing the applied voltage, the active adjustment of the absorption frequency band is realized.

The technical solution of the disclosure is implemented as follows:

According to one aspect of the disclosure, a controllable wave-absorbing metamaterial, comprises:

a substrate; and a metamaterial unit array layer disposed on the substrate and comprising a plurality of conductive geometric units that are periodically arranged, each of the conductive geometric units comprising a first hollow structure, second hollow structures, and conductive geometric structures;

wherein the second hollow structures are respectively extended from four vertices of the first hollow structure, and the conductive geometric structure is disposed between each two adjacent second hollow structures; and each of the second hollow structures comprises a first end facing toward the center of the conductive geometric unit and a second end facing away from the center of the conductive geometric unit;

wherein the first end of the second hollow structure is provided with a varactor diode connected to the conductive geometric structures at both sides, the second end of the second hollow structure is provided with a fixed capacitor and a fixed resistor that are spaced apart from each other; the fixed capacitor is connected to the conductive geometric structure at one side, and the fixed resistor is connected to the conductive geometric structure at the other side.

In an exemplary embodiment, a metal material is disposed between the fixed capacitor and the fixed resistor, and the metal material is in contact with the fixed capacitor and the fixed resistor.

In an exemplary embodiment, the fixed capacitor and the fixed resistor are connected in series through the metal material, and the varactor diode is arranged in parallel with the fixed capacitor and the fixed resistor that are connected in series.

In an exemplary embodiment, the shape of the conductive geometric structure is half of the regular octagon that is divided along the central axis of the regular octagon.

In an exemplary embodiment, the two opposite conductive geometric structures are symmetrical about a central axis passing through the center of the conductive geometric unit.

In an exemplary embodiment, the first hollow structure comprises:

two metal wires; wherein two ends of each metal wire are respectively in contact with conductive geometric structures that are opposite to each other, one of the metal wires is provided with a bent portion that is disposed in the substrate, the other one of the metal wires is disposed above the bent portion, such that the two metal wires are not in contact.

In an exemplary embodiment, the projection of the two metal wires is a cross structure.

In an exemplary embodiment, one side of the second hollow structure is connected to the first hollow structure, and the other side of the second hollow structure is connected to a third hollow structure.

In an exemplary embodiment, the substrate comprises:

a reflective layer; and a honeycomb structure layer;

wherein the honeycomb structure layer is disposed above the reflective layer.

In an exemplary embodiment, the controllable wave-absorbing metamaterial further comprises:

a wave-transparent protective layer, wherein the wave-transparent protective layer is disposed on the metamaterial unit array layer.

The beneficial technical effects of the disclosure are described as follows:

In the disclosure, the resistor and the varactor diode are introduced into the metamaterial structure, and the connection manner of the conductive geometric unit and the conductive geometric structure in the conductive geometric unit is reasonably designed, such that the absorption frequency band of the metamaterial can be changed by changing the applied voltage, and the active adjustment of the absorption frequency band is realized. In addition, the controllable wave-absorbing metamaterial of the disclosure has extremely low power consumption, which can be almost negligible, such that the power consumption defect of the electrically controllable wave-absorbing metamaterial is well solved.

BRIEF DESCRIPTION OF DRAWINGS

To describe the technical solutions in the embodiments of the disclosure or in the prior art more clearly, the following briefly describes the accompanying drawings required for describing the embodiments. Apparently, the accompanying drawings in the following description show merely some embodiments of the disclosure, and a person of ordinary skill in the art may still derive other drawings from these accompanying drawings without creative efforts.

DESCRIPTION OF EMBODIMENTS

The following clearly and completely describes the technical solutions in the embodiments of the disclosure with reference to the accompanying drawings in the embodiments of the disclosure. Apparently, the described embodiments are merely some but not all of the embodiments of the disclosure. All other embodiments obtained by a person of ordinary skill in the art based on the embodiments of the disclosure shall fall within the protection scope of the disclosure.

Figure 1:
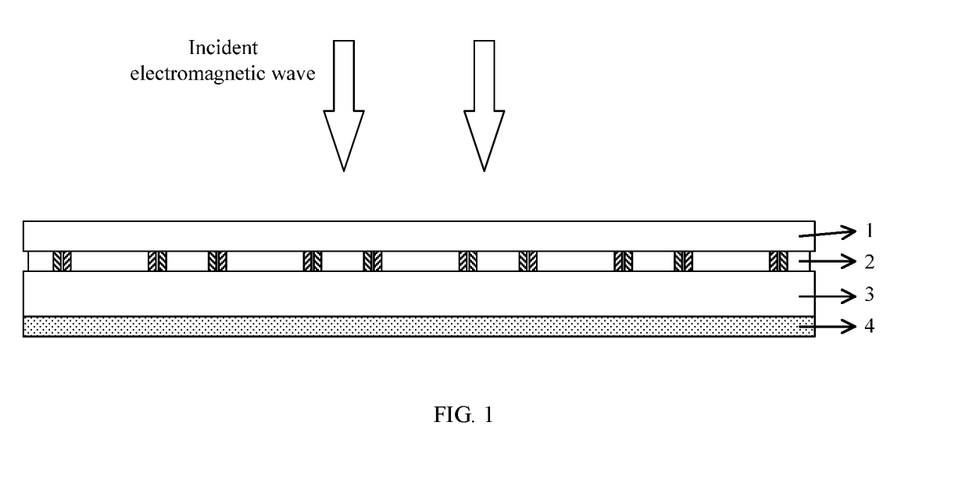
FIG. 1 is a schematic diagram of a cross section of a controllable wave-absorbing metamaterial according to an embodiment of the disclosure.
Figure 2:
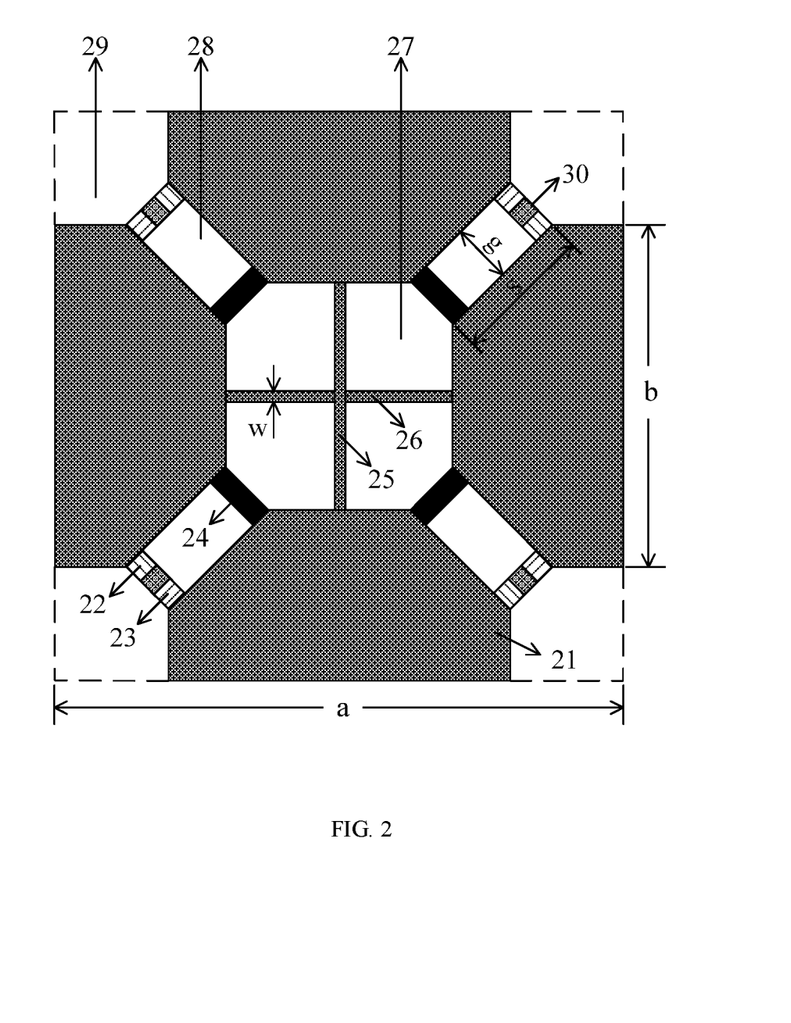
FIG. 2 is a schematic structural diagram of a conductive geometric unit according to an embodiment of the disclosure.

Referring to FIG. 1 and FIG. 2, the disclosure provides a controllable wave-absorbing metamaterial. The controllable wave-absorbing metamaterial includes: a substrate and a metamaterial unit array layer 2, the metamaterial unit array layer 2 is disposed on the substrate.

The metamaterial unit array layer 2 includes a plurality of conductive geometric units that are periodically arranged. Each of the conductive geometric units includes a first hollow structure 27, second hollow structures 28, and conductive geometric structures 21. The second hollow structures 28 are respectively extended from four vertices of the first hollow structure 27, and the conductive geometric structure 21 is disposed between each two adjacent second hollow structures 28; and each of the second hollow structures 28 includes a first end facing toward the center of the conductive geometric unit and a second end facing away from the center of the conductive geometric unit.

The first end of the second hollow structure 28 is provided with a varactor diode 24 connected to the conductive geometric structures 21 at both sides, the second end of the second hollow structure 28 is provided with a fixed capacitor 23 and a fixed resistor 22 that are spaced apart from each other. The fixed capacitor 23 is connected to a conductive geometric structure 21 at one side, and the fixed resistor 22 is connected to a conductive geometric structure 21 at the other side.

According to the above technical solution, the resistor and the varactor diode are introduced into the metamaterial structure, and the connection manner of the conductive geometric unit and the conductive geometric structure in the conductive geometric unit is reasonably designed, such that the absorption frequency band of the metamaterial can be changed by changing the applied voltage, and the active adjustment of the absorption frequency band is realized. In addition, the controllable wave-absorbing metamaterial of the disclosure has extremely low power consumption, which can be almost negligible, thereby well solving a power consumption defect of the electrically controllable wave-absorbing metamaterial.

In order to better describe the technical solution of the disclosure, the following section describes in detail through specific embodiments.

Continuing to refer to FIG. 1, the controllable wave-absorbing metamaterial can be divided into four layers. Along the incident direction of electromagnetic waves, the controllable wave-absorbing metamaterial sequentially includes a wave-transparent protective layer 1, a metamaterial unit array layer 2, a honeycomb structure layer 3, and a reflective layer 4 from top to bottom. The honeycomb structure layer 3 and the reflective layer 4 constitute the substrate. In addition, the thickness of the wave-transparent protective layer 1 is d1, the thickness of the metamaterial unit array layer 2 is d2, the thickness of the honeycomb structure layer 3 is d3, and the thickness of the reflective layer 4 is d4. Moreover, a skilled person in the art can set the thickness d1 of the wave-transparent protective layer 1, the thickness d2 of the metamaterial unit array layer 2, the thickness d3 of the honeycomb structure layer 3, and the thickness d4 of the reflective layer 4 according to actual needs. For example, according to an embodiment of the disclosure, the thickness d1 of the wave-transparent protective layer 1 is 0.8 mm, the thickness d2 of the metamaterial unit array layer 2 is 0.04 mm, the thickness d3 of the honeycomb structure layer 3 is 7 mm, and the thickness d4 of the reflective layer 4 is 0.1 mm; which is not limited in the disclosure.

In addition, although FIG. 1 shows that the substrate is constituted by the honeycomb structure layer 3 and the reflective layer 4, the substrate can also be set according to actual needs. For example, according to an embodiment of the disclosure, the honeycomb structure layer 3 can be replaced by PMI (polymethacrylimide) layer or PVC (polyvinyl chloride) layer, which is not limited in the disclosure. Moreover, the material of the reflective layer 4 can also be selected according to actual needs. According to another embodiment of the disclosure, the material of the reflective layer 4 can be carbon fiber or metal film, which is not limited in the disclosure.

Figure 3:
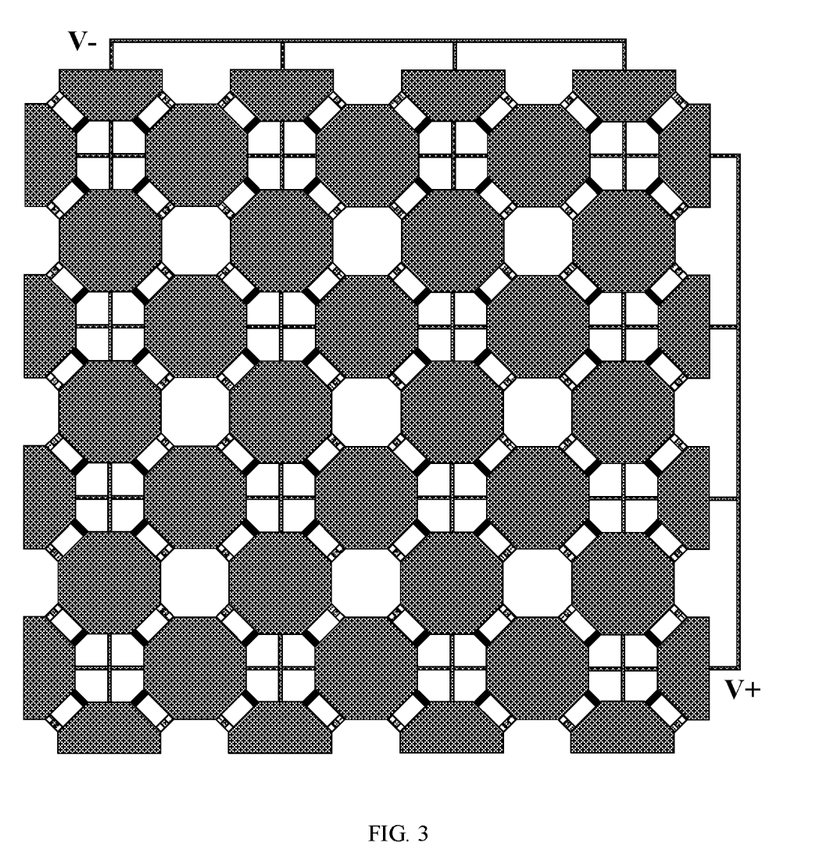
FIG. 3 is a schematic diagram of a metamaterial unit array layer after the voltage is applied according to an embodiment of the disclosure.

In addition, as shown in FIG. 3, the metamaterial unit array layer 2 includes a plurality of conductive geometric units that are periodically arranged as shown in FIG. 2. The shape of the conductive geometric unit can be set according to actual needs. For example, according to an embodiment of the disclosure, the shape of the conductive geometric unit is square, which is not limited in the disclosure. For ease of description, the following uses the conductive geometric unit in FIG. 2 being a square as an example of description.

In addition, referring to FIG. 2 continuously, the conductive geometric unit includes a first hollow structure 27 and the second hollow structures 28 that are respectively extended from four vertices of the first hollow structure 27, such that the conductive geometric unit includes four second hollow structures 28, and the four second hollow structure 28 are respectively disposed around the first hollow structure 27. Moreover, a conductive geometric structure 21 is further disposed between each two adjacent second hollow structures 28. The shape of the conductive geometric structure 21 is half of the regular octagon that is divided along the central axis of the regular octagon, and the two opposite conductive geometric structures 21 are symmetrical about the central axis passing through the center of the conductive geometric unit. But those skilled in the art should understand that the shape of the conductive geometric structure 21 in the metamaterial unit array is actually the regular octagon. In order to easily describe the conductive geometric unit herein, each regular octagon is divided along its central axis and divided into two ½ octagons, which respectively belong to two adjacent units.

Moreover, two surfaces of each second hollow structure 28 are in contact with the conductive geometric structure 21, each second hollow structure 28 further includes a first end facing toward the center of the conductive geometric unit and a second end facing away from the center of the conductive geometric unit. A varactor diode 24 is disposed at the first end of the second hollow structure 28, and is connected to conductive geometric structures 21 at both sides. A fixed resistor 22 and a fixed capacitor 23 are disposed at the second end of the second hollow structure 28, and are spaced apart from each other.

The fixed capacitor 23 is connected to the conductive geometric structure 21 at one side. A metal material 30 is disposed between the fixed resistor 22 and the fixed capacitor 23, and the metal material 30 is in contact with the fixed resistor 22 and the fixed capacitor 23, such that the fixed resistor 22 and the fixed capacitor 23 are connected in series through the metal material 30, the varactor diode 24 is arranged in parallel with the fixed resistor 22 and the fixed capacitor 23 that are connected in series, such that the circuit is not conductive. Therefore, in actual application, the power consumption of the wave absorber is almost negligible, and the power consumption defect of the controllable wave-absorbing metamaterial is well solved.

In addition, referring to FIG. 2 continuously, the first hollow structure 27 further includes: a metal wire 25 and a metal wire 26. Two ends of each metal wire 25 or 26 are respectively in contact with conductive geometric structures 21 that are oppositely arranged.

Moreover, in order to avoid the intersection of the metal wires in horizontal and vertical directions, the metal wire 25 can be inserted through the substrate and bent at the back of the substrate, such that the metal wire 25 is provided with a bent portion. Moreover, the metal wire 26 is disposed above the bent portion, so as to perform spatial dislocation treatment and ensure that the metal wire 25 and the metal wire 26 are not in contact. At the same time, the projection of the metal wire 25 and the metal wire 26 is a cross structure.

In addition, as shown in FIG. 2, the blank portion in the conductive geometric unit is hollowed out.

Herein, for convenience of description, a third hollow structure 29 is further defined.

One side of the second hollow structure 28 is connected to the third hollow structure 29, and the other side of the second hollow structure is connected to the first hollow structure 27.

Therefore, through the existence of the third hollow structure 29, the conductive geometric unit can be regarded as a square.

In addition, the skilled person in the art can certainly regard the second hollow structure 28 and the third hollow structure 29 as one second hollow structure 28.

In addition, it can be certainly understood that the material of the conductive geometric unit can be selected according to actual needs.

For example, according to an embodiment of the disclosure, the material of the artificial conductive geometric structure 21 is gold, silver, or copper, which is not limited in the disclosure.

Based on the foregoing arrangement, the conductive geometric unit includes four conductive geometric structures 21, four fixed resistors 22, four fixed capacitors 23, four varactor diodes 24, the horizontal metal wire 25, and the vertical metal wire 26. The fixed resistor 22, the fixed capacitor 23, and the varactor diode 24 are disposed between each two adjacent conductive geometric structures 21. The fixed resistor 22 and the fixed capacitor 23 are connected in series, and the varactor diode 24 is arranged in parallel with the fixed resistor 22 and the fixed capacitor 23 that are connected in series.

In addition, referring to FIG. 2 continuously, the side length of the conductive geometric unit is a, the distance between two opposite sides of the conductive geometric structure 21 is b, the side length of the second hollow structure 28 is s, the width of the second hollow structure 28 is g, the width of the metal wire 25 or the metal wire 26 is w, the resistance of the fixed resistor 22 is Res0, the capacitance of the fixed capacitor 23 is C0, and the capacitance of the varactor diode 24 is Cap.

In addition, it can be certainly understood that parameter values of the conductive geometric unit can be set according to actual needs. For example, according to an embodiment of the disclosure, the side length a of the conductive geometric unit is 30 mm, the distance between two opposite sides of the conductive geometric structure 21 is 18.2 mm, the side length s of the second hollow structure 28 is 7.5 mm, the width g of the second hollow structure 28 is 3 mm, the width w of the metal wire 25 or the metal wire 26 is 1 mm, the resistance Res0 of the fixed resistor 22 is 5005, the capacitance C0 of the fixed capacitor 23 is 1 pF, and the capacitance Cap of the varactor diode 24 is 1-16 pF.

In addition, referring to FIG. 3 continuously, a metamaterial unit array includes a plurality of conductive geometric units that are periodically arranged. By applying voltages across two adjacent sides of the metamaterial unit array, the active absorption frequency band can be adjusted by changing the applied voltage. Moreover, the power consumption of the absorber is extremely low, which can be almost negligible.

In order to better describe the technical effect of the controllable wave-absorbing metamaterial of the disclosure, the following section will be described through specific embodiments.

TABLE 1

| Parameter | Value |
| --- | --- |
| d1 | 0.8 mm |
| d2 | 0.04 mm |
| d3 | 7 mm |
| d4 | 0.1 mm |
| a | 30 mm |
| b | 18.2 mm |
| s | 7.5 mm |
| g | 3 mm |
| w | 1 mm |
| Res0 | 500 Ω |
| C0 | 1 pF |
| Cap | 1-16 pF |

Figure 4:
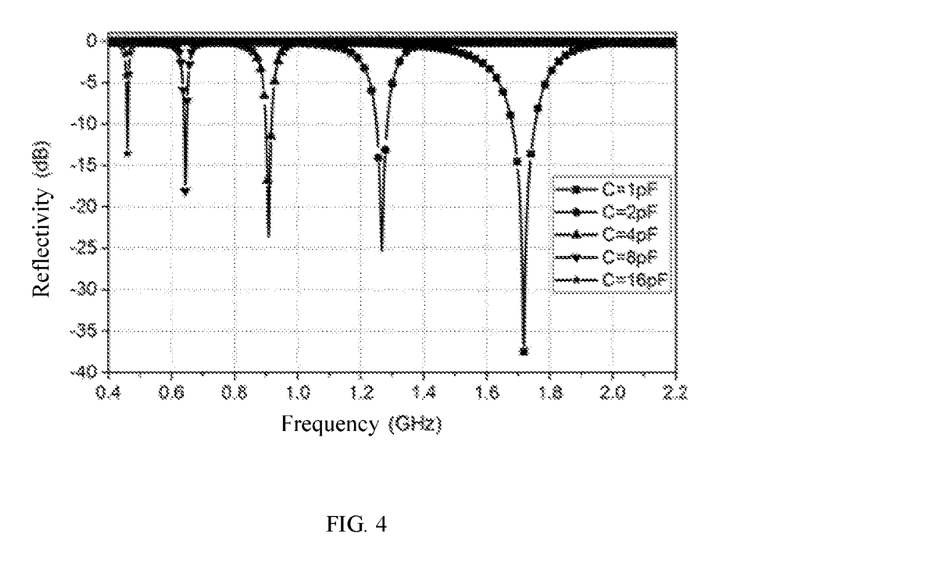
FIG. 4 is a schematic diagram of absorption effects of a controllable wave-absorbing metamaterial that correspond to different capacitances according to an embodiment of the disclosure.

Firstly, the structural size, the resistance, and the capacitance of the controllable wave-absorbing metamaterial are shown in Table 1. The voltage applied to the metamaterial unit array layer 2 changes from 1V to 28V, and the capacitance corresponding to the varactor diode 24 changes from 16 pF to 1 pF. Absorption peaks of the controllable wave-absorbing metamaterial under different capacitances are shown in FIG. 4. As can be seen from FIG. 4, the capacitance changes from 16 pF to 1 pF, the corresponding absorption peak increases from 0.46 GHz to 1.72 GHz, and the position of the absorption peak changes by 3.74 times, crossing the P-L bands.

In addition, a skilled person in the art should understand that it is only an embodiment, and the absorption peak can be adjusted within P-Ku frequency band by changing the structural size and selecting varactor diodes 24 with different capacitance variation range, so as to cover operating bands of most currently-used detection radars.

Figure 5:
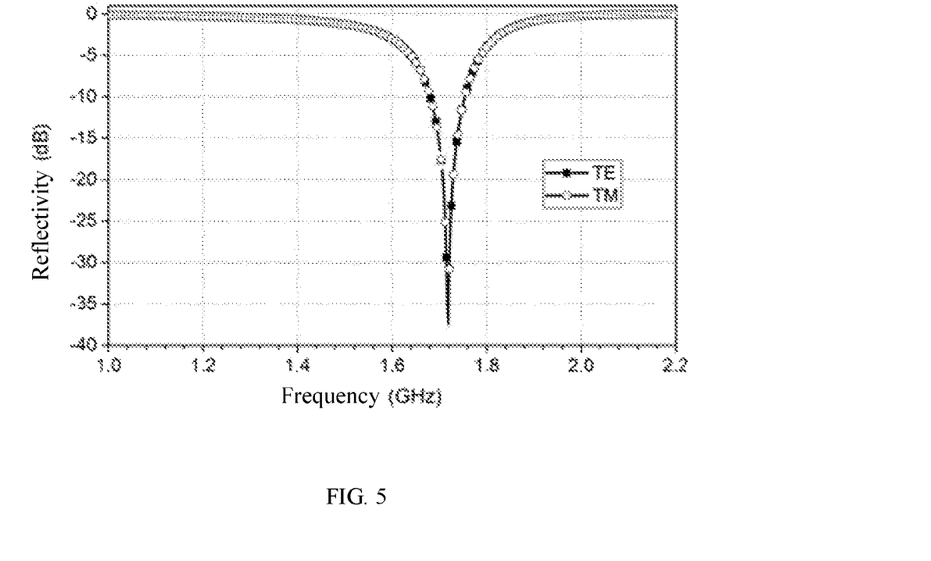
FIG. 5 is a schematic diagram of absorption effect of a controllable wave-absorbing metamaterial on two polarized waves according to an embodiment of the disclosure.

Secondly, FIG. 5 shows absorption effect of the conductive geometric unit on a polarized TE wave (a horizontal polarized wave) and a polarized TM wave (a vertical polarized wave), and the capacitance of the corresponding varactor diode 24 is 1 pF. It can be seen from FIG. 5 that reflectivity curves under the two polarized waves almost overlap, indicating that the controllable wave-absorbing metamaterial, having low power consumption, of the disclosure is insensitive to polarization.

In addition, in this embodiment, the total thickness of the controllable wave-absorbing metamaterial is 7.94 mm, and the wavelength corresponding to the absorption peak of 0.46 GHz is 652 mm, such that the thickness of the metamaterial is only 1/82 of the wavelength, which is much smaller than the conventional 1/4 wavelength absorbing structure. Therefore, the metamaterial shows excellent ultra-thin properties, which can greatly reduce the consumption and weight of materials in actual use.

In summary, according to the above technical solution of the disclosure, by reasonably designing the connection manner of the conductive geometric unit and the conductive geometric structure in the conductive geometric unit, the following beneficial effects can be achieved: the absorption frequency band of the metamaterial can be changed by changing the applied voltage, such that the active adjustment of the absorption frequency band is realized; the adjustable absorbing metamaterial has the same effect on the two polarized waves; the controllable absorbing metamaterial has excellent ultra-thin absorbing characteristics; the power consumption of the controllable absorbing metamaterial is extremely low, which can be almost negligible, therefore the power consumption defect of the electrically controllable wave-absorbing metamaterial is well solved.

The foregoing are merely preferred embodiments of the disclosure, but are not intended to limit the disclosure. Any modification, equivalent replacement, or improvement made within the spirit and principle of the disclosure shall fall within the protection scope of the disclosure.

What is claimed is:

1. A controllable wave-absorbing metamaterial, comprising:
    a substrate; and
    a metamaterial unit array layer disposed on the substrate and comprising a plurality of conductive geometric units that are periodically arranged, each of the conductive geometric units comprising a first hollow structure, second hollow structures, and conductive geometric structures;
    wherein the second hollow structures are respectively extended from four vertices of the first hollow structure, and the conductive geometric structure is disposed between each two adjacent second hollow structures; and each of the second hollow structures comprises a first end facing toward the center of the conductive geometric unit and a second end facing away from the center of the conductive geometric unit;
    wherein the first end of the second hollow structure is provided with a varactor diode connected to the conductive geometric structures at both sides, the second end of the second hollow structure is provided with a fixed capacitor and a fixed resistor that are spaced apart from each other; the fixed capacitor is connected to the conductive geometric structure at one side, and the fixed resistor is connected to the conductive geometric structure at the other side.

2. The controllable wave-absorbing metamaterial as claimed in claim 1, wherein a metal material is disposed between the fixed capacitor and the fixed resistor, and the metal material is in contact with the fixed capacitor and the fixed resistor.

3. The controllable wave-absorbing metamaterial as claimed in claim 2, wherein the fixed capacitor and the fixed resistor are connected in series through the metal material, and the varactor diode is arranged in parallel with the fixed capacitor and the fixed resistor that are connected in series.

4. The controllable wave-absorbing metamaterial as claimed in claim 1, wherein the shape of the conductive geometric structure is half of the regular octagon that is divided along the central axis of the regular octagon.

5. The controllable wave-absorbing metamaterial as claimed in claim 1, wherein the two opposite conductive geometric structures are symmetrical about a central axis passing through the center of the conductive geometric unit.

6. The controllable wave-absorbing metamaterial as claimed in claim 1, wherein the first hollow structure comprises:
    two metal wires; wherein two ends of each metal wire are respectively in contact with conductive geometric structures that are opposite to each other, one of the metal wires is provided with a bent portion that is disposed in the substrate, the other one of the metal wires is disposed above the bent portion, such that the two metal wires are not in contact.

7. The controllable wave-absorbing metamaterial as claimed in claim 6, wherein the projection of the two metal wires is a cross structure.

8. The controllable wave-absorbing metamaterial as claimed in claim 6, wherein the width of each metal wire is 1 mm.

9. The controllable wave-absorbing metamaterial as claimed in claim 6, wherein the conductive geometric unit comprises four conductive geometric structures, four fixed resistors, four fixed capacitors, four varactor diodes, and the two metal wires.

10. The controllable wave-absorbing metamaterial as claimed in claim 1, wherein one side of the second hollow structure is connected to the first hollow structure, and the other side of the second hollow structure is connected to a third hollow structure.

11. The controllable wave-absorbing metamaterial as claimed in claim 1, wherein the substrate comprises:
   a reflective layer; and
   a honeycomb structure layer;
   wherein the honeycomb structure layer is disposed above the reflective layer.

12. The controllable wave-absorbing metamaterial as claimed in claim 11, wherein the thickness of the honeycomb structure layer is 7 mm, and the thickness of the reflective layer is 0.1 mm.

13. The controllable wave-absorbing metamaterial as claimed in claim 11, wherein the honeycomb structure layer is replaced by PMI (polymethacrylimide) layer or PVC (polyvinyl chloride) layer.

14. The controllable wave-absorbing metamaterial as claimed in claim 11, wherein the material of the reflective layer is carbon fiber or metal film.

15. The controllable wave-absorbing metamaterial as claimed in claim 1, further comprising:
   a wave-transparent protective layer, wherein the wave-transparent protective layer is disposed on the metamaterial unit array layer.

16. The controllable wave-absorbing metamaterial as claimed in claim 15, wherein the thickness of the wave-transparent protective layer is 0.8 mm, the thickness of the metamaterial unit array layer is 0.04 mm.

17. The controllable wave-absorbing metamaterial as claimed in claim 1, wherein the shape of the conductive geometric unit is square.

18. The controllable wave-absorbing metamaterial as claimed in claim 1, wherein the resistance of the fixed resistor is 500Ω, the capacitance of the fixed capacitor is 1 pF, and the capacitance of the varactor diode is 1-16 pF.

19. The controllable wave-absorbing metamaterial as claimed in claim 1, wherein the side length of the conductive geometric unit is 30 mm, the distance between two opposite sides of the conductive geometric structure is 18.2 mm, the side length of the second hollow structure is 7.5 mm, the width of the second hollow structure is 3 mm.

* * * * *